(12) United States Patent
Chen

(10) Patent No.: US 7,403,427 B2
(45) Date of Patent: Jul. 22, 2008

(54) METHOD AND APPARATUS FOR REDUCING STRESS IN WORD LINE DRIVER TRANSISTORS DURING ERASURE

(75) Inventor: Chung-Zen Chen, Hsinchu (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 205 days.

(21) Appl. No.: 11/284,281

(22) Filed: Nov. 21, 2005

(65) Prior Publication Data

US 2007/0115729 A1 May 24, 2007

(51) Int. Cl.
*G11C 11/34* (2006.01)

(52) U.S. Cl. .......................... 365/185.29; 365/185.13; 365/185.11

(58) Field of Classification Search ............ 365/185.29, 365/185.13, 185.11, 185.23, 185.24, 185.17
See application file for complete search history.

(56) References Cited

U.S. PATENT DOCUMENTS

| | | | |
|---|---|---|---|
| 5,995,418 A * | 11/1999 | Chen et al. ............ | 365/185.29 |
| 6,246,608 B1 * | 6/2001 | Odani ...................... | 365/185.2 |
| 2005/0237829 A1 * | 10/2005 | Nakamura et al. .......... | 365/199 |
| 2006/0050559 A1 * | 3/2006 | Sakui et al. ............ | 365/185.17 |

OTHER PUBLICATIONS

Kang-Deog Suh et al., "A 3.3 V 32 Mb NAND Flash Memory with Incremental Step Pulse Programming Scheme," IEEE Journal of Solid-State Circuits, vol. 30, No. 11, Nov. 1995.

* cited by examiner

*Primary Examiner*—Dang T Nguyen
(74) *Attorney, Agent, or Firm*—Duane Morris LLP

(57) ABSTRACT

In a method of erasing flash memory cells, the flash memory cells organized in selectable memory blocks, the erasing step comprising applying an erase pulse voltage to a commonly biased cell well of at least one selected and at least one unselected memory blocks, the method comprising the steps of: raising the erase pulse voltage to a first intermediate voltage less than a target erase pulse voltage; maintaining the erase pulse voltage at the first intermediate voltage for a first period of time; after the first time period, raising the erase pulse voltage to the target erase pulse voltage; and maintaining the erase pulse voltage at the target erase pulse voltage during an erase operation.

12 Claims, 4 Drawing Sheets

METHOD AND APPARATUS FOR REDUCING STRESS IN WORD LINE DRIVER TRANSISTORS DURING ERASURE

FIELD OF THE INVENTION

The present invention generally relates to flash memory devices and to methods of erasing data therefrom.

BACKGROUND OF THE INVENTION

NAND type EEPROMs (Electrically Erasable Programmable Read Only Memories) or flash memories have been developed for solid-state mass storage applications for portable music players, mobile telephones, digital cameras, and the like, as well as have been considered as a replacement for hard disk drives (HDDs).

Referring to FIG. 1, a circuit diagram of an electrically erasable programmable read-only memory is shown comprising an array of memory cells, which is formed on a chip substrate. As will be recognized by those in the art, FIG. 1 is a circuit diagram of a portion of a NAND flash memory array. Various components, such as column and row decoders, sense circuitry and other control circuitry are not shown but are familiar to those in the art.

An exemplary memory array is partitioned into many memory "blocks." Each block has several "pages." A page has many memory "cells." For example, a 1 Gb memory has 1024 blocks, and one block has 64 pages. Each page has 2K bytes of bits (i.e., 16K bits). A word line contains a page or multiple pages. A cell string or two cell strings are provided per block in the bit line direction. A cell string has 16 bits, 32 bits or The illustrated memory array of FIG. 1 includes a plurality of parallel bit lines BL1, BL1, BL2 . . . through BLn coupled to memory cells defined at intersections of individual bit lines and word lines of the memory array. In the illustrated memory, the individual cells are floating gate flash cells, although other cell structures, such as SONOS or split gate flash cells are used in some EEPROMs. Parallel word lines WL0, WL1, WL2 . . . WL15 are formed over the substrate so as to form control gates for the individual flash memory cells. Selection transistors are associated with each bit line and are coupled to signals SS and GS.

Block select signal BK is used to select a block of memory cells and bias the gate terminal of the NMOS pass/driving transistors. The driving transistors receive global word line signals GWL0, GWL1, . . . through GWL15, respectively, at their drain terminals for biasing word lines WL0 to WL15, respectively, during program and erasing. CS designates the common source line. A cell string is connected to a bit line through SS selection transistor on one side and to CS through the GS transistor.

The tables of FIG. 1 show the program and erase conditions for the flash memory of FIG. 1. The erase conditions are of particular note. During erasure, all of the word lines in a string of the selected block are grounded and the cell well voltage (VW) is raised to about 20V. This large voltage difference forces the electrons stored in the floating gate to escape into the cell well. The unselected blocks share the common cell well with the selected block, which is biased at the high voltage. The corresponding word lines in the unselected block are floating. Since the coupling factor between the cell well and the floating control gate (i.e., the floating word line) has been reported at about 98%, the word line voltage of these unselected blocks is coupled to about the voltage level of the cell well (the P well of the NMOS memory cells), i.e., about 20V. The corresponding word line pass transistors of these unselected blocks are turned off, as select signal BK is set to 0V for the unselected block. The driving transistors of the unselected blocks, therefore, experience about a 20V stress from source node (i.e., the word line voltage node) to the gate node (i.e., the block select node). If the gate oxide thickness of the pass transistors is about 300 Å, then the resulting electrical field is about 6.7MV/cm (20V/300 Å), which produces reliability concerns for the high density NAND flash. For example, in current 1 Gbyte NAND flash devices have 1024 blocks, 64 pages per block, two pages per word line, and each word line divided into two lines to reduce RC delay, there are 64K driver transistors (1024×32×2) that can be stressed.

Therefore, there remains a need for an improved flash memory erase procedure, as well as an improved flash memory, that considers the voltage stress on the driving transistors of unselected blocks.

SUMMARY OF THE INVENTION

In a method of erasing flash memory cells, the flash memory cells organized in selectable memory blocks, the erasing step comprising applying an erase pulse voltage to a commonly biased cell well of at least one selected and at least one unselected memory blocks, the method comprising the steps of: raising the erase pulse voltage to a first intermediate voltage less than a target erase pulse voltage; maintaining the erase pulse voltage at the first intermediate voltage for a first period of time; after the first time period, raising the erase pulse voltage to the target erase pulse voltage; and maintaining the erase pulse voltage at the target erase pulse voltage during an erase operation.

The method can be readily implemented into a Flash memory device to implement the exemplary erase methodology described herein. By conditioning the cell well voltage during ramp up to the targeted erase voltage, the word line driving transistors of an unselected memory block can be protected from undesired voltage stresses, an ever increasing concern with Flash memory devices, particularly with increased memory densities.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 1:
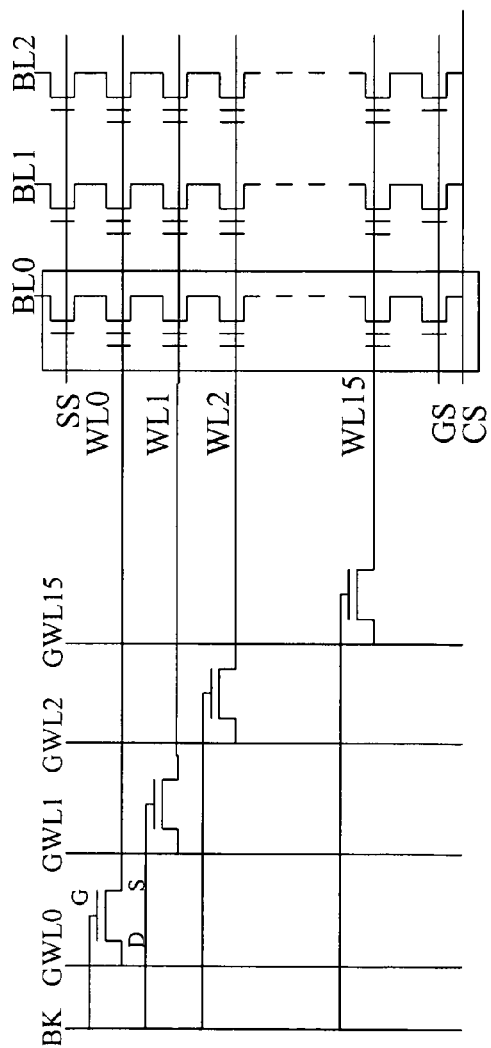
FIG. 1 is circuit diagram of a portion of a prior art flash memory having a plurality of NAND memory cells and program/erase bias conditions therefor.
Figure 2B:
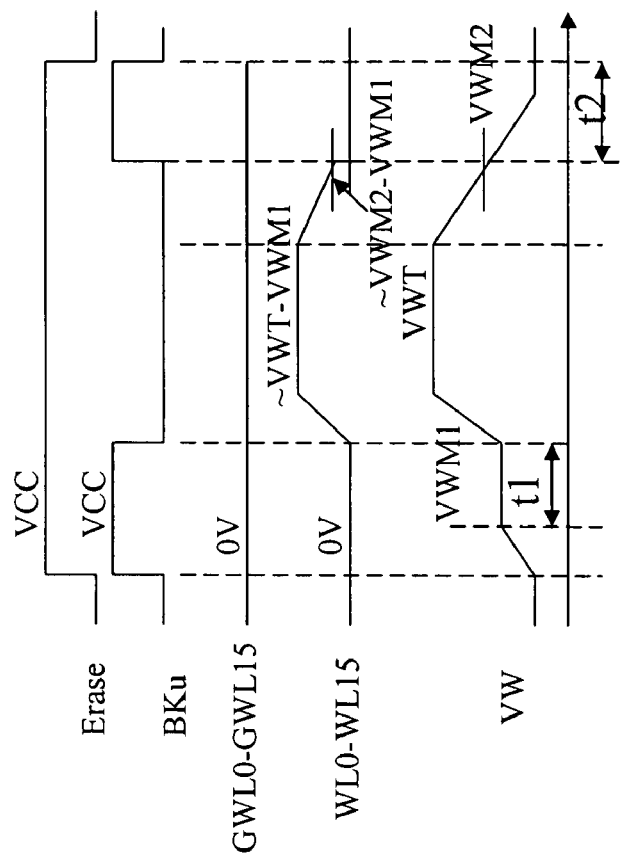
FIGS. 2A and 2B illustrate an exemplary erase method of the present invention.
Figure 2A:
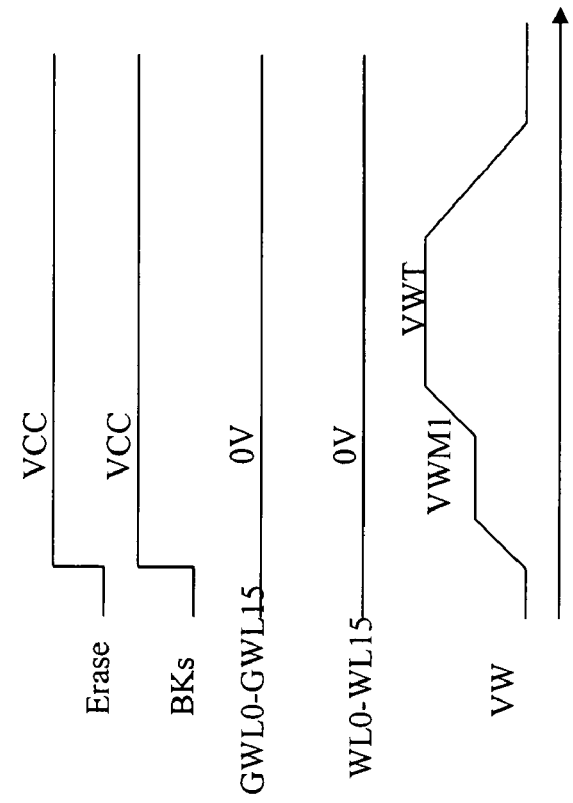

FIG. 2 shows signals from an improved erase method for flash memories, such as shown in, for example, FIG. 1. FIG. 2 shows the bias conditions for various nodes for both selected (FIG. 2A) and unselected (FIG. 2B) memory blocks.

Memory blocks are selected for erasure by raising block select signal $BK_S$ to VCC. Erase control signal ERASE is set to VCC during the erase process. As with the prior art erase methods, global word line signals GWL0-GWL15 are grounded (i.e., set to 0V), meaning word lines WL0-WL15 are set to 0V. Unlike the prior art erasure method described above, however, and as described below in more detail, in the exemplary erase method, the cell well voltage VW is raised to its peak voltage VWT (e.g., 20V) in at least one stepped increment.

Turning to FIG. 2B, which shows the signal voltages for the unselected block, rather than the block select signal BK being off for the entire erase cycle, signal $BK_U$ is initially turned on (i.e., set to VCC) to temporarily turn on the word line driving transistors of the unselected block. Because the driving transistors are on, the global word line signals GWL0-GWL15 are transferred to the word lines WL0-WL15. Therefore, during this period, WL0-WL15 are driven to 0V. Also during this time period the well voltage VW is raised to an intermediate voltage VWM1, for example 5V. Because there is some RC delay in the word lines, the farthest nodes of the word lines need a certain amount of time to decay any voltage coupled to the word lines from the cell well to the voltage 0V driven by the activated driving transistors. Therefore, block select signal $BK_U$ is left on long enough to allow for this voltage decay and then turned off. In an exemplary embodiment, the duration that VW stays at VWM1 is only for a few microseconds, such as between about 5-20 µs.

In order to avoid erasing at the un-selected block as well as to reduce the stress on the word line driver transistor, VWM1 may be between about 3V to 6V. The stressed electrical field will be dropped from 6.7MV/cm (20V/300 Å) to between about 5.7 MV/cm (17V/300 Å) to 4.7MV/cm (14V/300 Å). The timing for ramping up and ramping down of the cell well voltage is much shorter than the period when the cell well voltage stays at its peak voltage VWT. Higher voltage VWT has much larger erasing efficiency. The cell well is kept at VWT for a time period in the order of milliseconds whereas the ramping up and down of the cell well voltage takes place in the order of microseconds.

As should be understood, when $BK_U$ is turned off after t1, the driving transistors turn off and the word lines are left floating. The cell well voltage VW is then raised to its targeted voltage VWT, such as 20V. In this embodiment, the floated word line will be coupled to approximately VWT-VWM1, or to about 15V if VWM1 is 5V. When the well voltage is raised to VWM1, the word line initially will be coupled to about VWM1, but this coupled voltage is discharged through the word line driving transistor to 0V. For sake of simplicity, this coupling/discharge cycle is not shown in FIG. 2B and the word line voltages are shown at 0V when $BK_U$ is turned on. After this point, the cell well voltage VW is raised from VWM1 to VWT. The difference between these two voltages is 15V, assuming VWM1 is 5V and VWMT is 20V. The driving transistors are off during this period. Therefore, the floating word line is coupled up from about 0V, the voltage at the end of time t1, to about 15V. The electrical field stress on the driving transistors is reduced to 5MV/cm (15V/300 Å), which is acceptable, because $V_{GS}$ of the driving transistors is lowered to about 15V rather than 20V. VWM1 is selected to provide an acceptable electrical field value and is, therefore, dependent on, for example, the peak, targeted cell well voltage VWT and the thickness of the oxide of the gate dielectric layer of the driving transistors.

During this period, i.e., when VW is at VWT, the flash cells of the unselected block are only biased at about 5V from cell well (20V) to control gate (15V). Under this bias, the erase disturbance is negligible. The cell well voltage VW is maintained at VWT until erasure is over and then pulled down to VSS.

$BK_U$ remains low for a period while VWT decreases in order to provide for sufficient erase time. If VW is pulled directly down to VSS without turning on $BK_U$, however, the floating word lines may be coupled to a negative voltage. Specifically, since the PN junction of the driver transistor on the word line side will be turned on, it will keep the word line at about -0.5V, rather than dropping all the way to -VWM1 after VW passes through VWM1. The possibility of a negative voltage (e.g., -0.5V) at least raises concerns relating to latch-up, i.e., the unwanted turn on of the pn junction of the MOSFETS. Therefore, in one embodiment, when VW reaches an intermediate voltage VWM2, such as 5V, which is at or higher than VWM1, $BK_U$ is again turned on. Turning $BK_U$ high again turns on the driving transistors of the unselected block, which in turn drives the word lines to 0V, i.e., the global word line voltage. When VW reaches VWM2, the coupled voltage at the word line WL0-WL15 is approximately (VWT-VWM1)-(VWMT-VWM2), i.e., VWM2-VWM1, which is designed to be at, or preferably above, 0V. If VWM1 is 5V, then VWM2 can be 5V or higher, thereby avoiding any latch-up concern. In exemplary embodiments, VWM2 is higher than VWM1. In embodiments, VWM2 can be between about 5V to 8V, for example, to guarantee the un-selected word line has voltage larger than 0V.

Figure 3:
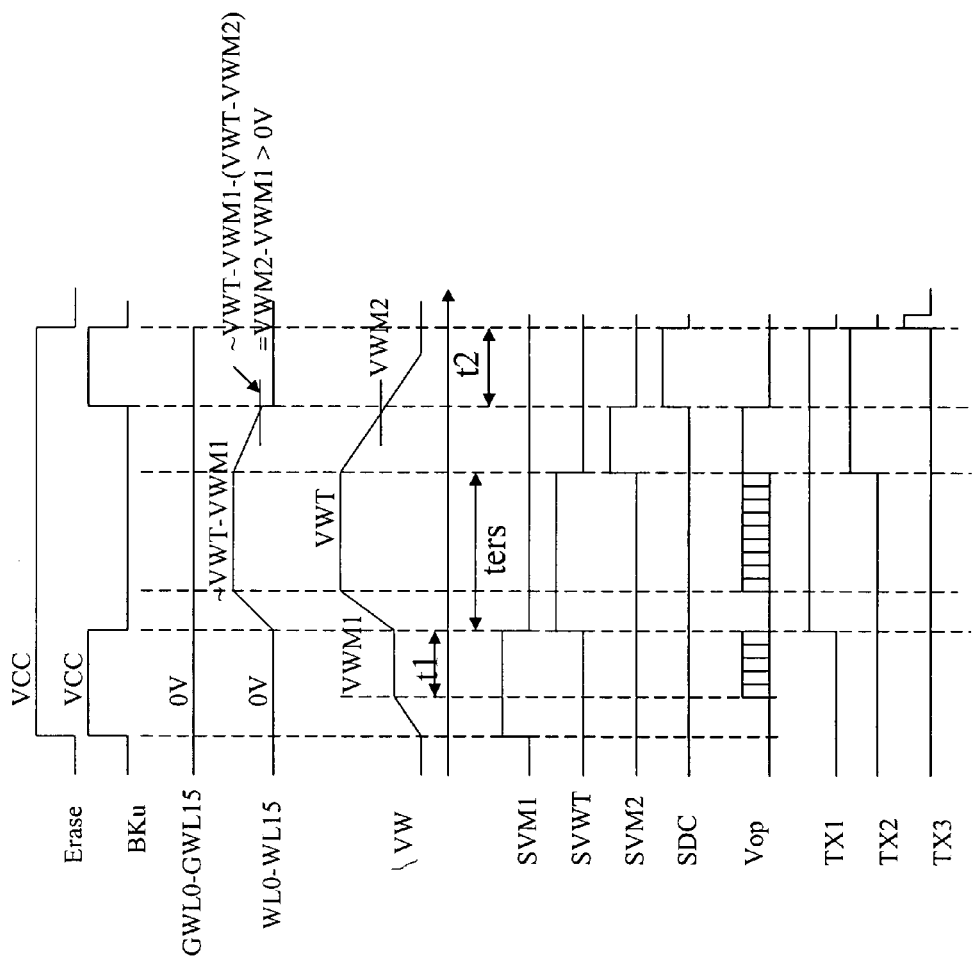
FIG. 3 is a timing diagram illustrating the exemplary erase method of FIG. 2.

FIG. 3 is a control signal diagram for the exemplary erase protocol described above, and FIG. 4 is a circuit diagram illustrating an exemplary implementation circuit 10 of the control signal diagram of FIG. 3 for generating the improved cell well voltage signal VW. FIG. 3 shows ERASE control pulse is high during the erase process. As described above, $BK_U$ is high from the beginning of the erase operation until cell well voltage VW begins to rise to the target voltage VWT from first intermediate voltage VWM1. Signal $BK_U$ is also turned high again after the cell well voltage falls below second intermediate voltage VWM2. Global word line signals GWL0-GWL15 are maintained at 0V throughout the erase procedure. As explained above, word lines WL0-WL15 couple up to about VWT-VWM1 after $BK_U$ is turned off and while the cell well voltage VW is maintained at its target voltage VWT. Cell well voltage VW is held at voltage VWM1 for a time period "t1" that is long enough for the word lines to substantially discharge any coupled voltage to the 0V global word line voltage. Generally, time t1 is only a few microseconds, whereas the erase signal (ERASE) lasts a time that is a few milliseconds, such as 2 ms. The word line voltages then track the decline of the cell well voltage towards VSS until $BK_U$ again turns on, driving the word lines to the global word line voltage 0V. Time "t2"—the time period for which signal $BK_U$ is turned on a second time—is also a few microseconds. The timing of the remaining signals are described in connection with the circuit diagram of FIG. 4.

Figure 4:
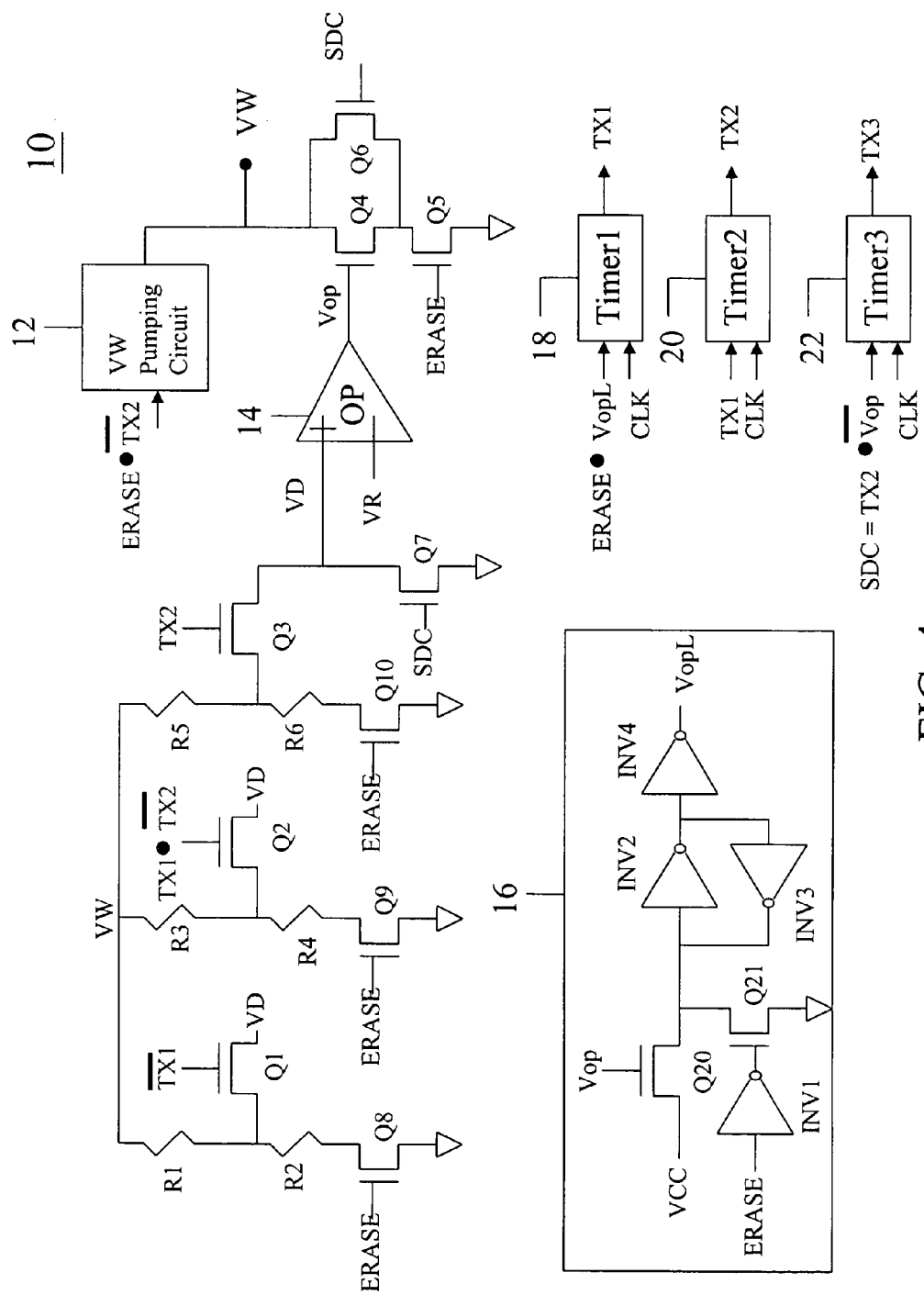
FIG. 4 is a circuit diagram of an exemplary circuit for implementing the erase method of FIGS. 2 and 3.

FIG. 4 is a circuit/system diagram of an exemplary circuit 10 for generating the signal waveform VW of FIG. 3 and various timer signals. The circuit 10 includes a charge pump circuit 12 coupled through NMOS discharge paths Q4/Q5 and Q6/Q5. The discharge paths are turned on by control signals Vop and SDC, respectively. The control signal Vop is generated by operational amplifier 14, which has a reference voltage input VR and a resistor divider input VD. The circuit 10 includes three resistor dividers selectively coupled to node VD by transistors Q1, Q2 and Q3, respectively, which are responsive to control signals "not TX1", "TX and not TX2" and "TX2", respectively. The first resistor divider includes resistors R1 and R2; the second resistor divider includes resistors R3 and R4; and the third resistors divider includes resistors R5 and R6. Each divider is coupled between cell well voltage VW and ground (VSS), via a respective NMOS transistor Q8, Q9, Q10. NMOS Q7 grounds node VD responsive to control signal SDC. In one embodiment, the circuit 10 also includes three timer circuits 18, 20, and 22 described in more detail below.

In an exemplary embodiment, the resistors R1 to R6 have the following ratio:

$$R2/(R1+R2) \times VWM1 = VD = VR;$$

$$R3/(R3+R4) \times VWT = VD = VR;$$

$$R5/(R5+R6) \times VWM2 = VD = VR.$$

The resistances can be designed in the order of mega ohms to control the current through these resistors in the order of 10 µA.

In one example, assume VWM1 is 5V, VWT is 20V, VWM2 is 5V and VR is 1.2V. If the bottom resistor R2, R4, R6 of each divider is set to 200 kΩ, then resistors R1, R3 and R5 would be 0.633 MΩ, 3.13 MΩ and 0.633 MΩ, respectively.

As is described in more detail below, when a divider is coupled to node VD, the charge pump 12 is on and discharge path Q4/Q5 is active, the divider, charge pump and operational amplifier act as a regulated voltage supply, maintaining voltage VW at a voltage level VWM1 or VWT for example when desired.

Pumping circuits 12 are familiar to those in the art. In one embodiment, pumping circuit 12 comprises a two phase or four phase pumping circuit.

When the erase period is started, signal ERASE in FIG. 4 (which corresponds to signal ERASE of FIG. 3) is high. There are three timers 18, 20, and 22 to count times t1, ters, and t2. In one embodiment, the timers comprise ripple counters, although other kinds of timers readily may be substituted. Clock signal CLK is the system clock with a fixed period. When the input signals to the timers are at high state, the timer will be active to count to its designated time. The output signals of these timers—TX1, TX2, and TX3—are at low state initially. When erase operation is started, ERASE is active and VW pumping circuit is activated by ERASE and not TX2. As can be seen from FIG. 3, signal not TX1 is on for the first turn on period of signal $BK_U$. During this time period, the pumping circuit 12 of FIG. 4 is active. The pumping circuit 12 provides erase pulse voltage VW. VW is raised gradually to VWM1 and transistor Q1 is turned on by signal not TX1 to pass the resistor divider signal from the resistor divider R1,R2 to the input node (designated node VD in FIG. 4) of the comparator/operational amplifier 14 of FIG. 4 to compare with the reference voltage, VR. The operational amplifier 14 outputs signal, Vop responsive to the comparison. Signal Vop will turn high when VW reaches VWM1 and triggers the timer 18 to start counting, as described below in more detail. Vop is low until VW reaches VWM1. When turned on, the charge pump 12 continues to raise voltage VW until a discharge path is activated, i.e., by a high Vop or by a high signal SDC described below.

The Vop signal will toggle between high and low since the VW leakage path, which includes series connected NMOS transistors Q4 and Q5, will discharge VW. Once VW is pulled down to below VWM1, Vop will toggle to low to turn off this leakage path. The first positive Vop will be latched as VopL signal as shown in latch circuit 16, and timer 18 starts to count. Therefore, VW is regulated at VWM1 for a period of time "t1," after which time control signal TX1 is turned on by timer 18. As explained above in connection with FIG. 2B, time t1 is set to wait for the unselected word line to stabilize to 0V, since each word line's farthest end has an RC delay to the word line driving transistor. The signal VopL is set to low state initially since ERASE is low. The low state of ERASE will turn on the Q21 transistor and set VopL at low state through the two inverters, INV2 and INV4. INV2 and INV3 will latch this state when ERASE is turned on and Q21 is off. Once Vop is high, the power signal VCC passes to VopL since Q20 is on, and VopL is latched at high state until ERASE is off again.

After timer 18 counts time t1, it turns timer signal TX1 on as shown in FIG. 3, transistor Q1 turns off, and signal TX1 and not TX2 turns on. Signal TX1 and not TX2 triggers the turn on of the cell well voltage VW to its target voltage VWT. With signal TX1 and not TX2 on, transistor Q2 turns on to pass the resistor divider signal from the resistor divider R3,R4 to the input node VD of the operational amplifier 14. During this time period, VW will be regulated at VWT. Vop will toggle between high and low to perform the voltage regulation. Turning on TX1 triggers timer 20 to start counting and continues to count until time "ters" expires. After time ters, signal TX2 is then activated to trigger the ramp down of VW from voltage level VWT to VSS.

When TX2 is active, the erase operation will be over or substantially over, and the pumping circuit 12 is disabled. Transistor Q2 is off, disconnecting the resistor divider R3,R4 from the operational amplifier input node VD. Signal TX2 is activated and thus NMOS Q3 is turned on to allow for detection of when cell well voltage VW is discharged to voltage level VWM2 set by resistor divider R5,R6. Before VW reaches VWM2, the Vop output signal is high, as VD from the third resistor divider exceeds VR, and the leakage path Q4, Q5 is turned on to discharge VW. When VW reaches VWM2, VD drops below VR and Vop will switch to low. The low level of Vop and the high level of signal TX2 triggers another timer—Timer 22—to go active, i.e. to begin to count. The unselected block signal $BK_U$ is active and the word line is shorted to ground through the word line driver transistor.

There is a RC delay to wait for the farthest ends of the word lines to discharge to ground, although not shown in the figures for the sake of simplicity. Therefore, this timer 22 counts time "t2" to account for this RC delay. During this period t2, signal SDC is activated to discharge the VW through NMOS series connected transistors Q6 and Q5. The VD signal is pulled to ground by turning on transistor Q7. Vop is, therefore, kept at a low state, as the voltage at node VD of the operational amplifier 14 is less than the reference voltage VR.

Signal TX3 is activated when timer 22 counts to time t2. ERASE and SDC are turned off by the activation of TX3. Time t2 timing is determined by at least two factors. One factor is the time its takes to discharge the cell well charge, VW*Cw, where Cw is the cell well capacitance. Q5 and Q6 transistor sizes are preferably selected to discharge this charge within a few microseconds. The other factor is the time to discharge the word line which is coupled down by the discharging of VW. The RC delay is about 5 to 20 µs., so the t2 timing is about 10-20 µs. Turn on of signal TX3 is used to turn off ERASE signal using, for example, a simple switch circuit (not shown). Then, erase control signal ERASE turns off, and the off state of ERASE turns off signals TX1, TX2 and TX3. Therefore, signal TX3 is a pulse signal. Signal ERASE can be generated by a state machine in one embodiment.

The circuit of FIG. 4 can be readily implemented into a Flash memory device to implement the exemplary erase methodology described herein. By conditioning the cell well voltage during ramp up to the targeted erase voltage, the word line driving transistors of an unselected memory block can be protected from undesired voltage stresses, an ever increasing concern with Flash memory devices, particularly with increased memory densities.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention

What is claimed is:

1. A method of erasing flash memory cells, the flash memory cells organized in selectable memory blocks, the erasing step comprising applying an erase pulse voltage to a commonly biased cell well of at least one selected and at least one unselected memory blocks, the method comprising the steps of:
    (a) raising the erase pulse voltage to a first intermediate voltage less than a target erase pulse voltage;
    (b) maintaining the erase pulse voltage at the first intermediate voltage for a first period of time;
    (c) after step (b), raising the erase pulse voltage to the target erase pulse voltage; and
    (d) maintaining the erase pulse voltage at the target erase pulse voltage during an erase operation.

2. The method of claim 1, further comprising the steps of:
during steps (a) and (b), activating select transistors associated with word lines in the unselected block to select the word lines; and
applying a global word line voltage to the selected word lines.

3. The method of claim 2, wherein the global word line voltage is at or near ground.

4. The method of claim 1, further comprising the steps of:
during steps (a) and (b), selecting word lines in the unselected block to apply a global word line voltage to the word lines; and
during steps (c) and (d), floating the word lines.

5. The method of claim 4, further comprising the steps of:
after step (d), lowering the erase pulse voltage from the target erase pulse voltage;
detecting when the erase pulse voltage reaches a second intermediate voltage less than the target erase pulse voltage; and
in response to the detection, selecting word lines in the unselected block to apply a global word line voltage to the word lines.

6. The method of claim 5, wherein the second intermediate voltage is greater than or equal to the first intermediate voltage.

7. The method of claim 5, wherein the global word line voltage is at or near ground.

8. The method of claim 2, wherein the global word line voltage is at or near ground, and the first time period is long enough for the word lines to substantially settle to the global word line voltage.

9. A method of erasing flash memory cells, the flash memory cells organized in selectable memory blocks, the erasing step comprising applying an erase pulse voltage to a commonly biased cell well of at least one selected and at least one unselected memory blocks, the method comprising the steps of:
    coupling word lines in the unselected block to a global word line voltage using word line driving transistors associated with the unselected block;
    while the word lines are coupled to the global word line voltage, raising the erase pulse voltage to a first intermediate voltage less than a target erase pulse voltage and maintaining the erase pulse voltage at the first intermediate voltage for a first period of time sufficient for the word lines to substantially settle at the global word line voltage; and
    after the first time period, decoupling the word lines from said global word line voltage using said word line driving transistors, raising the erase pulse voltage to the target erase pulse voltage and maintaining the erase pulse voltage at the target erase pulse voltage during an erase operation,
    whereby the word line driving transistors associated with the unselected block are protected from undesired voltage stresses during said erasing step.

10. The method of claim 9, wherein the global word line voltage is at or near ground.

11. The method of claim 9, further comprising the steps of:
after the erase operation, lowering the erase pulse voltage from the target erase pulse voltage;
detecting when the erase pulse voltage reaches a second intermediate voltage less than the target erase pulse voltage; and
in response to the detection, selecting word lines in the unselected block and applying the global word line voltage to the word lines.

12. The method of claim 11, wherein the second intermediate voltage is greater than or equal to the first intermediate voltage.

* * * * *